United States Patent [19]
Yaba et al.

[11] Patent Number: 5,326,729
[45] Date of Patent: Jul. 5, 1994

[54] TRANSPARENT QUARTZ GLASS AND PROCESS FOR ITS PRODUCTION

[75] Inventors: Susumu Yaba; Shinya Kikugawa, both of Yokohama, Japan

[73] Assignee: Asahi Glass Company Ltd., Tokyo, Japan

[21] Appl. No.: 13,396

[22] Filed: Feb. 4, 1993

[30] Foreign Application Priority Data

Feb. 7, 1992 [JP] Japan ................................. 4-056774
Dec. 9, 1992 [JP] Japan ................................. 4-352095

[51] Int. Cl.$^5$ ............................................. C03C 3/06
[52] U.S. Cl. ..................................... 501/54; 501/53; 501/154; 423/352; 423/335; 423/341; 423/644; 65/900; 65/DIG. 8
[58] Field of Search ................. 65/3.11, 900, DIG. 8; 252/588; 501/53, 54, 154; 423/352, 335, 341, 644

[56] References Cited

U.S. PATENT DOCUMENTS

| | | | |
|---|---|---|---|
| 3,806,570 | 4/1974 | Flamenbaum et al. | 501/54 |
| 4,221,825 | 9/1980 | Guerder et al. | 501/54 |
| 4,938,788 | 7/1990 | Segawa et al. | 65/900 |
| 5,086,352 | 2/1992 | Yamagata et al. | 65/900 |

FOREIGN PATENT DOCUMENTS 34419 2/1991 Japan .

Primary Examiner—Karl Group
Assistant Examiner—Michael Marcheschi
Attorney, Agent, or Firm—Oblon, Spivak, McClelland, Maier & Neustadt

[57] ABSTRACT

Quartz glass obtained by flame-hydrolyzing a glass-forming raw material to obtain fine particles of quartz glass, having the fine particles of quartz glass deposited and grown on a substrate to obtain a porous quartz glass product and heating the porous quartz glass product to obtain a transparent quartz glass product, which has an OH content of not more than 10 ppm and a halogen content of at least 400 ppm and which contains hydrogen.

3 Claims, 1 Drawing Sheet

*1: COMPARATIVE EXAMPLE 3
*2: COMPARATIVE EXAMPLE 2
*3: COMPARATIVE EXAMPLE 1
*4: EXAMPLE 1

*1: COMPARATIVE EXAMPLE 3
*2: COMPARATIVE EXAMPLE 2
*3: COMPARATIVE EXAMPLE 1
*4: EXAMPLE 1

TRANSPARENT QUARTZ GLASS AND PROCESS FOR ITS PRODUCTION

BACKGROUND OF THE INVENTION

1. FIELD OF THE INVENTION

The present invention relates to quarts glass particularly excimer laser resistant quartz glass and a process for its production.

2. DISCUSSION OF BACKGROUND

Quartz glass is a material which is transparent in a wide wavelength regions from near infrared region to vacuum ultraviolet region, and has an extremely small thermal expansion coefficient, whereby it is excellent in dimensional stability. Furthermore, the quartz glass is excellent in chemical durability. Therefore, the quartz glass has been widely used as substrate material for photomask in a lithography step of production of LSI.

However, in conventional quartz glass, structural defects are induced when it is exposed to high energy of ultraviolet radiation such as plasma etching or excimer laser during a photomask processing step, whereby problems such as decrease of transmission in ultraviolet region, formation of fluorescence center, etc. are arised. Particularly, the conventional quartz glass has problems as substrate for photomask used in lithography of VLSI wherein ArF excimer laser or KrF excimer laser is used as light source of exposure. Further it has problems, as optical parts constituting an optical system wherein the above-mentioned excimer laser is used as light source.

Various attempts have been reported as means for solving the above-mentioned problems, and it has been known that such problems can be solved by having a hydrogen molecule contained in quartz glass in any arbitrary means. However, sufficient effects can not be necessarily expected unless quartz glass in which hydrogen is contained is specified. For example, Japanese Unexamined Patent Publication No. 201664/1989 discloses a method wherein quartz glass is subjected to heat treatment in an atmosphere containing hydrogen. However, it is impossible to completely suppress an absorption band in the vicinity of 260 nm and fluorescence in the vicinity of 650 nm formed when KrF laser is irradiated to quartz glass which is formed by transparent vitrification of a porous quartz glass product obtainable by flame hydrolysis of a glass-forming raw material.

On the other hand, as means for imparting to quartz glass excimer laser resistance, Japanese Unexamined Patent Publication No. 88742/1991 discloses a method wherein a hydrogen molecule is dissolved in quartz glass. However, the method is required to dissolve a large amount of hydrogen molecules in the quartz glass. Therefore, there is such a problem that the quartz glass is required to be subjected to heat treatment in a hydrogen atmosphere having risk of explosion, even under elevated pressure, whereby a large scale of equipment is necessary.

Further, a method for producing quartz glass which does not contain OH at all, wherein a porous quartz glass product obtained by flame hydrolysis of a glass-forming raw material is subjected to heat treatment in a halogen atmosphere, has been known, for example, as transparent vitrification method of porous quartz glass of VAD method, which is a method for producing low-loss quartz glass fibers. However, the quartz glass subjected to transparent vitrification has a strong absorption band in the vicinity of 250 nm and can not be used as substrate for photomask in lithography using KrF excimer laser. Furthermore, when the quartz glass is irradiated by KrF excimer laser, strong fluorescence is observed in the vicinity of 285 nm, 390 nm and 460 nm and the luminescence is blue by visual observation. In particular, if the quartz glass has fluorescence at 285 nm, it can not be used as substrate for photomask in lithography using KrF excimer laser as light source of exposure because the wavelength is within the photosensitive range of a resist.

SUMMARY OF THE INVENTION

It is an object of the present invention to solve the above-mentioned problems and to provide quartz glass having excimer laser resistance which is free from an absorption band and fluorescence due to structural defects, when irradiated by excimer laser.

Under the circumstances, the present inventors have conducted extensive research in order to impart excimer laser resistance to quartz glass which is formed by subjecting porous quartz glass obtainable by flame-hydrolysis of a glass-forming raw material to transparent vitrification. As a result, they have found that quartz glass having excimer laser resistance can be produced by conducting the below-mentioned dehydration treatment in a temperature range lower than the transparent vitrification temperature of the porous quartz glass followed by transparent vitrification and molding it into a desired shape followed by a treatment in a hydrogen atmosphere. The present invention is based on this finding and provides quartz glass obtained by flame-hydrolyzing a glass-forming raw material to obtain fine particles of quartz glass, having the fine particles of quartz glass deposited and grown on a substrate to obtain a porous quartz glass product and heating the porous quartz glass product to obtain a transparent quartz glass product, which has an OH content of not more than 10 ppm and a halogen content of at least 400 ppm and which contains hydrogen and a process for producing quartz glass having an OH content of not more than 10 ppm and a halogen content of at least 400 ppm and containing hydrogen, which comprises:

(1) a step of having fine particles of quartz glass obtained by flame-hydrolysis of a glass-forming raw material deposited and grown on a substrate to obtain a porous quartz glass product, (2) a step of maintaining the porous quartz glass product in a temperature range of not higher than the transparent vitrification temperature to dehydrate the porous quartz glass product, (3) a step of heating the dehydrated porous quartz glass product to the transparent vitrification temperature to conduct transparent vitrification to obtain a transparent quartz glass product, (4) a step of heating the transparent quartz glass product to a temperature of not lower than the softening point to mold it into a desired shape to obtain a molded quartz glass product, and (5) a step of subjecting the molded quartz glass product to a heat treatment in a hydrogen-containing atmosphere.

DETAILED DESCRIPTION OF THE PREFERRED EMBODIMENTS

Figure 1:
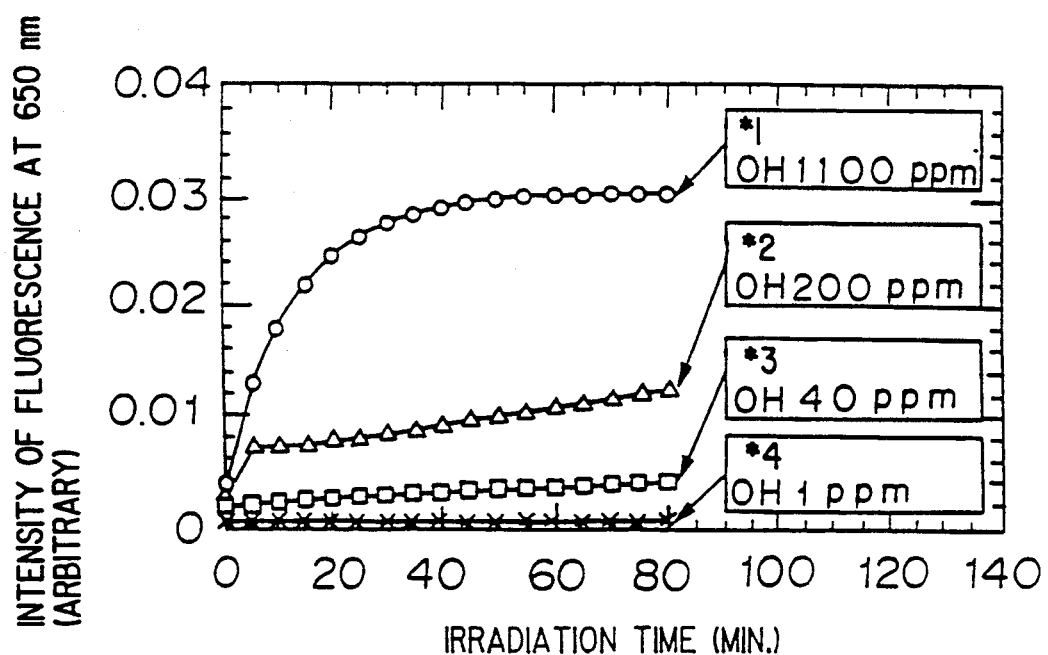
FIG. 1 is a graph showing a relation between irradiation time and intensity of fluorescence at 650 nm in irradiation of KrF excimer laser to quartz glass.

The present invention will be described in detail.

The OH content according to the present invention is obtained from an absorption based on stretching vibration of Si—OH in the quartz glass observed in the vicinity of 2.7 μm in the infrared spectrum of the quartz glass (J. P. Williams et al.: J. Am. Ceram. Soc., Vol. 55, pp. 524–527)

Transparent quartz glass products having different OH concentrations are produced by flame-hydrolyzing a glass-forming raw material to obtain fine particles of quartz glass, having the fine particles deposited and grown on a substrate to obtain a porous quartz glass product, and subjecting to the porous quartz glass product to dehydration treatment and transparent vitrification.

Further, after having hydrogen molecules contained in the quartz glass, the relation between an intensity of fluorescence at 650 nm due to structural defects induced by excimer laser irradiation and an OH concentration in the quartz glass is studied. As a result, it has been found that the intensity of fluorescence at 650 nm strongly depends on the OH content in the quartz glass as shown in FIG. 1. Namely, the intensity of fluorescence at 650 nm is in proportion to the OH content in the quartz glass. When the OH content is reduced to a level of 40 ppm, the fluorescence at 650 nm becomes very weak to reach a level at which there is no substantial problem as optical parts such as photomask. Furthermore, when the OH content is not more than 10 ppm, the fluorescence at 650 nm can be completely suppressed, such being desirable.

In order to further reduce the OH content in quartz glass, the quartz glass is subjected .to a dehydration treatment by a halogen gas at a temperature of not higher than the transparent vitrification and KrF excimer laser is irradiated to the quartz glass. As a result, it is found that the quartz glass has strong fluorescence at 285 nm, 390 nm and 460 nm. The present inventors conduct a heat treatment to the quartz glass dehydrated by the halogen gas under a hydrogen atmosphere to have hydrogen contained in the quartz glass, and excimer laser resistance is evaluated. As a result, it is found that the degree of suppression of each fluorescence depends on the concentration of the halogen contained in the quartz glass. Namely, if the halogen concentration in the quartz glass is at least 400 ppm, the fluorescence at 285 nm, 390 nm and 460 nm can be suppressed by inclusion of hydrogen molecules. Preferably, if the halogen concentration is at least 500 ppm, each fluorescence can be completely suppressed. On the other hand, if the halogen concentration is less than 400 ppm, the fluorescence at 390 nm is not completely suppressed, such being undesirable.

Although it is not clear how the halogen exists in the quartz glass, the amount of OH can be decreased by the presence of at least 400 ppm of halogen in the quartz glass. Further, when hydrogen is contained in the quartz glass in addition to halogen, fluorescence at 650 nm as well as 285 nm, 390 nm and 460 nm by irradiation of KrF excimer laser can be suppressed to a level at which no substantial problem is arised.

On the other hand, quartz glass samples having different hydrogen contents are prepared and effects of the hydrogen molecule contained in the quartz glass are studied. From the relation between an amount of dissolved hydrogen measured by Raman spectrometry and fluorescence by irradiation of KrF excimer laser, quartz glass having an OH content of 10 ppm and a dissolved hydrogen content of $4.4 \times 10^{17}$ molecule/cm$^3$, shows fluorescence at 390 nm by irradiation of KrF excimer laser. On the other hand, if quartz glass contains dissolved hydrogen in an amount of not more than $1 \times 10^{17}$ molecule/cm$^3$, which is less than the detection limit by Raman method and OH in an amount of not more than 10 ppm, no fluorescence at 390 nm is observed and fluorescence at 650 nm is also substantially suppressed.

Then, an amount of hydrogen released when the quartz glass is heated at 1,000° C. under vacuum is evaluated and it is found that the amount of hydrogen released of the above-mentioned quartz glass having excimer resistance is $0.9 \times 10^{20}$ molecule/m$^2$. On the other hand, quartz glass having an amount of hydrogen released of $1.5 \times 10^{20}$ molecule/m$^2$ does not show sufficient suppression of fluorescence at 390 nm. Further, quartz glass containing a small amount of hydrogen molecules at a level of an amount of hydrogen released being $5 \times 10^{17}$ molecule/m$^2$emits luminescence at 285 nm and 460 nm, and the intensity of luminescence at 650 nm is increased as a laser is irradiated.

As one of preferred embodiments of the present invention, fine particles of quartz glass obtained by preliminarily subjecting a glass-forming raw material to flame-hydrolysis in oxyhydrogen flame is deposited and raised on a substrate, and the resulting porous quartz glass product is dehydrated in a halogen atmosphere in a temperature range of not higher than the temperature of transparent vitrification. After the dehydration, the dehydrated glass product is continued to heat to the transparent vitrification temperature to obtain a transparent quartz glass product. Then, the transparent quartz glass product is heated at a temperature of not lower than the softening point to mold it into a desired shape, followed by a heat treatment in a hydrogen atmosphere, whereby a quartz glass product having excellent excimer laser resistance can be obtained.

As the substrate, substrates in the form of rod or plate generally used in this field, can be used. For example, a quartz glass substrate in the form of rod can be used (Japanese Examined Patent Publication No. 24937/1988).

As glass-forming raw material to be used in the present invention, there is no particular restriction so long as gasification is possible. However, from the viewpoint of workability and cost, halogenated silicon compound, for example, chlorides such as $SiCl_4$, $SiHCl_3$, $SiH_2Cl_2$ and $Si(CH_3)Cl_3$, fluorides such as $SiF_4$, $SiHF_3$ and $SiH_2F_2$, bromides such as $SiBr_4$ and $SiHBr_3$ and iodides such as $SiI_4$, are preferred. A porous quartz glass product is formed by subjecting these glass-forming raw materials to hydrolysis in oxyhydrogen flame as usual and having fine particles of quartz glass deposited and grown on a substrate.

The porous quartz glass product thus obtained is maintained in a halogen atmosphere for a certain period of time under heating and then the porous quartz glass is heated to the temperature of transparent vitrification to obtain a transparent quartz glass product. Namely, a porous product is, for example, placed in an electric furnace capable of controlling an atmosphere, and is heated at a constant temperature raising rate. After reaching a predetermined temperature, a gas containing a halogen gas in an amount of from 0.01 to 5% by volume is introduced to change the atmosphere to a halogen-containing atmosphere.

As the halogen, iodine, bromine, chlorine and fluorine are mentioned and one of them is suitably selected. From the viewpoint of handling, chlorine or fluorine is preferred. In particular, from the viewpoint of corrosion resistance of a material for furnace, etc., chlorine is preferred. As the source of halogen, in addition to a chlorine gas and a fluorine gas, halides such as $CCl_4$, $CHCl_3$, $SiCl_4$, etc. for chlorine source and $SF_6$, $CHF_3$, $SiF_4$, etc. for fluorine source may be used. The halogen concentration in the treatment under a halogen atmosphere is preferred from 0.01 to 5% by volume. If the halogen concentration exceeds 5%, the halogen contained in the porous quartz glass is liberated when the porous quartz glass is continuously heated for transparent vitrification, whereby transparent vitrification does not proceed, such being undesirable. On the other hand, the concentration is less than 0.01%, no effects by the halogen treatment can be recognized, such being undesirable.

As the temperature range for the dehydration treatment, a range of 800° to 1,250° C. is preferred. If the temperature is less than 800° C., dehydration effects by a dry gas or halogen can not be obtained. On the other hand, if the temperature exceeds 1,250° C., vitrification on a surface of the porous product proceeds, and dehydration of the porous quartz glass product can not be effectively proceed, such being undesirable.

Further, as the period of time to maintain in this temperature range, it is difficult to generally decide such a period of time because it depends on the treating temperature, the halogen gas concentration, the volume of the porous quartz glass products, etc. A range of from 1 to 30 hours, may be mentioned. The OH content of the quartz glass can be determined by absorption at 3,680 $cm^{-1}$ of Si—OH by means of FTIR spectrometry, and the OH content of the quartz glass after dehydrated by a halogen gas becomes not more than 10 ppm.

The porous quartz glass dehydrated by the halogen gas as mentioned above, is heated continuously to transparent vitrification temperature to conduct transparent vitrification. The transparent vitrification temperature is not particularly restricted so long as the temperature is within a range of from 1,350° to 1,500° C.

The transparent quartz glass product thus obtained is molded into a desired shape by heating it at a temperature range of not lower than the softening point. As the temperature range of this step, a range of 1,600° to 1,800° C. is preferred. If the temperature is less than 1,600° C., it is difficult to actually conduct molding because the viscosity of the quartz glass product is too high and devitrification proceeds by crystallization, such being undesirable. On the other hand, if the temperature exceeds 1,800° C. sublimation of the quartz glass product occurs, such being undesirable.

Then, quartz glass molded into a desired shape, is continuously fitted in the electric furnace capable of controlling the atmosphere in order to have hydrogen molecules contained, and the temperature is raised to the treating temperature. After reaching the treating temperature, a gas containing hydrogen is introduced to change the atmosphere of the furnace to the hydrogen atmosphere. The concentration of hydrogen is preferred not less than 30% by volume. If the concentration is less than the value, a necessary amount of hydrogen cannot be introduced, such being undesirable. The hydrogen concentration of not less than 90% by volume is more preferred.

The temperature for the treatment with hydrogen is preferred in a range of from 500° to 1,100° C. If the temperature is less than 500° C., the diffusion coefficient of hydrogen molecules is small and it take long period of time to include hydrogen, such being undesirable. On the other hand, the temperature exceeds 1, 100° C. a center of fluorescence at 390 nm is formed by a reaction with hydrogen molecules, such being undesirable. The amount of hydrogen dissolved in the quartz glass is decreased in accordance with increase of the temperature, and it is preferred in a range of from 800° to 1,000° C.

The quartz glass produced by the above steps has the OH content of not more than 10 ppm and the halogen content of at least 400 ppm.

Further, the quartz glass thus obtained contains hydrogen molecules in an amount of less than detected limit by Raman method and the amount of hydrogen released is not more than $1 \times 10^{20}$ molecule/$m^2$. Furthermore, the quartz glass thus obtained has excimer laser resistance which is free from formation of a absorption band and center of fluorescence by radiation of KrF excimer laser. According to the present invention, a high purity of synthetic raw material can be used as the glass-forming raw material for the quartz glass, and a purity of the quartz glass of the present invention has such an extremely high quality that the total content of impurities of heavy metal elements such as iron, nickel, etc., and an alkali metal elements such as sodium, potassium, etc. is not more than 1 ppm because no molten step is required and no impurities from a crucible, etc. is included.

A mechanism to form a center of fluorescence at 650 nm and to show red by irradiation of high energy of ultraviolet such as excimer laser to quartz glass, is not clear and it is said that non bridging oxygen radical in the quartz glass is the cause of the mechanism. Further, it is known that the non bridging oxygen radical is formed by irradiation of excimer laser to dissolved oxygen molecules and oxygen-excess type defect (Si—O—O—Si). The present inventors have found that an OH group in the quartz glass is converted to non bridging oxygen radical during irradiation of excimer laser. Accordingly, it becomes an important factor for excimer laser resistance to decrease amounts of dissolved oxygen molecules, oxygen-excess type defects and OH groups which would become a precursor of non bridging radical.

According to the present invention, by defining the OH content to be not more than 10 ppm, the content of OH, which is one of precursor of a non bridging radical, can be decreased, whereby effects to decrease fluorescence at 650 mm and the absorption band in the vicinity of 260 nm which is an excitation wavelength of the luminescence, by the irradiation of excimer laser, can be obtained. Further, by having hydrogen contained, the oxygen-excess type defect and dissolved oxygen molecules can be removed, whereby effects to improve resistance to excimer laser can be obtained.

Furthermore, by inclusion of an appropriate amount of hydrogen to quartz glass in which OH groups are completely removed by the dehydration with halogen, the oxygen-excess type defect and dissolved oxygen molecules which can not be removed by the dehydration with halogen, can be removed, and centers of fluorescence at 285 nm, 390 nm and 460 nm newly formed by the dehydration with halogen can be removed, whereby excimer laser resistance can be further improved to provide quartz glass having perfect excimer laser resistance.

Now, the present invention will be described with reference to Examples. However, it should be understood that the present invention is by no means restricted to these specific Examples.

EXAMPLE 1

A porous quartz glass product having diameter of 9 cm and a length of 10 cm which was obtained by subjecting SiCl$_4$ to hydrolysis in oxyhydrogen flame and having the resulting fine particles of quartz glass deposited and grown on a substrate in accordance with a conventional method, was fitted in an electric furnace having a graphite heating element capable of controlling an atmosphere at room temperature under an ordinary pressure. Then, the temperature was raised to 1,200° C. at a temperature raising rate of 500° C./hr and then, a nitrogen gas containing 2% of chlorine gas was introduced to change the atmosphere to the chlorine-containing atmosphere. The temperature was maintained at 1,250° C. for 4 hours. After completion of the dehydration in the chlorine atmosphere, 100% of He gas was introduced to change the atmosphere to a He atmosphere and the dehydrated porous quartz glass product was heated to 1,500° C. at a temperature raising rate of 500° C./hr and maintained at 1,500° C. for 3 hours to conduct transparent vitrification.

The transparent quartz glass product thus obtained was heated to 1,750° C., a temperature of not lower than the softening point, in an electric furnace having a carbon heating element and self-weight deformation was conducted, followed by molding into a block shape of 3×3×4 cm. Leaving the molded block in the electric furnace, the temperature of the electric furnace was continuously lowered to 1,200° C. and then annealing was conducted at a cooling rate of 30° C./hr. When the temperature of the furnace reached 1,000° C., power supply was stopped and the quartz glass was left to cool in the furnace.

The quartz glass block thus obtained was placed in an electric furnace capable of controlling an atmosphere and the temperature was raised to 1,000° C. at a temperature raising rate of 300° C./hr. When the temperature reached 1, 000° C., 100% hydrogen gas was introduced under atmospheric pressure to change the atmosphere of the furnace to a hydrogen atmosphere. The quartz glass was maintained at the temperature for 7 hours to have hydrogen molecule contained.

The amount of OH contained in the quartz glass thus obtained was 1 ppm and the concentration of chlorine contained in the quartz glass was 1,000 ppm. The amount of hydrogen released when heated to 1,000° C. in vacuum was $0.9 \times 10^{20}$ molecule/m$^2$. KrF excimer laser was irradiated to the quartz glass under conditions of 200 mJ/cm$^2$·pulse and 200 Hz and an intensity of fluorescence was measured (MPCD-1000 manufactured by. OTSUKA ELECTRONICS CO., LTD.). As shown in FIG. 1, the quartz glass did not show fluorescence at 650 nm by irradiation of KrF excimer laser, and therefore, it was confirmed there was no absorption band in the vicinity of 260 nm. Accordingly, the quartz glass is suitable for photomask substrate or optical parts using KrF excimer laser as light source.

COMPARATIVE EXAMPLE 1

A porous quartz glass product having diameter of 35 cm and a length of 100 cm which was obtained in the same manner as in Example 1, was fitted in an electric furnace capable of controlling an atmosphere at room temperature under ordinary pressure. Then, the atmosphere in the electric furnace was replaced with nitrogen gas having a water vapor partial pressure of 0.002 mmHg and the temperature was raised to 1,000° C. at a temperature raising rate of 500° C./hr while supplying nitrogen gas having a water vapor partial pressure of 0.002 mmHg. The temperature was continued to raise to 1,250° C. at a temperature raising rate of 50° C./hr, and the porous quartz glass product was maintained at the temperature for 5 hours to dehydrate.

The heat-treated porous quartz glass thus obtained was placed in an upper part of an electric furnace wherein the maximum inner temperature is controlled to be 1,450° C. for transparent vitrification, and the interior of the furnace was replaced with helium gas having a water vapor partial pressure of 0.002 mmHg. Then, transparent vitrification was conducted by descending the porous quartz glass product through the maximum temperature region at a rate of 80 mm/hr.

The transparent quartz glass thus obtained was heated to 1,750° C., a temperature of not lower than the softening point, in an electric furnace having a carbon heating element and self-weight deformation was conducted, followed by molding into a block shape of 16×16×30 cm. Leaving the molded block in the electric furnace, the temperature of the furnace was continuously lowered to 1,200° C. and then annealing was conducted at a cooling rate of 30° C./hr. When the temperature of the furnace reached 1,000° C., power supply was stopped and the quartz glass was left to cool in the furnace.

A quartz glass product of 16×16×2 cm was cut out from the molded quartz glass block thus obtained, and placed in an electric furnace capable of controlling an atmosphere. The temperature of the furnace was raised to 1,000° C. at a temperature raising rate of 300° C./hr. When the temperature reached 1,000° C., 100% hydrogen gas was introduced under atmospheric pressure to replace the atmosphere of the furnace to a nitrogen atmosphere. The quartz glass product was maintained at the temperature for 15 hours to have hydrogen molecules contained in the quartz glass.

The amount of OH contained in the quartz glass thus obtained was 40 ppm and the amount of dissolved hydrogen determined by Raman spectrometry was not more than $1 \times 10^{17}$ molecule/cm$^3$. Further, the amount of hydrogen molecule released when heated to 1,000° C. in vacuum was $0.3 \times 10^{20}$ molecule/cm$^2$. The quartz glass thus obtained was irradiated by KrF excimer laser under conditions of 200 mJ/cm$^2$·pulse and 200 Hz and an intensity of fluorescence was measured. As shown in FIG. 1, the quartz glass showed very weak fluorescence at 650 nm although it raised no substantial problem as optical parts such as photomask.

COMPARATIVE EXAMPLE 2

A porous quartz glass product having diameter of 35 cm and a length 100 cm was obtained in the same manner as in Example 1. Without conducting dehydration, the porous quartz glass thus obtained was placed in an upper part of an electric furnace wherein the maximum inner temperature is controlled to be 1,450° C. for transparent vitrification, and the interior of the furnace was replaced with helium gas having a water vapor partial pressure of 0.002 mmHg. Then, transparent vitrification was conducted by descending the porous quartz glass product through the maximum temperature region at a rate of 80 mm/hr.

The transparent quartz glass thus obtained was heated to 1,750° C., a temperature of not lower than the softening point, in an electric furnace having a carbon heating element and self-weight deformation was conducted, followed by molding into a block shape of 18×18×20 cm. The molded block was left in the furnace, and the temperature of the furnace was continuously decreased to 1,200° C. and then annealing was conducted at a cooling rate of 30° C./hr. When the temperature of the furnace reached 1,000° C., power supply was stopped and the quartz glass was left to cool in the furnace.

A quartz glass product of 18×18×1 cm was cut out from the quartz glass block thus obtained, and placed in an electric furnace capable of controlling an atmosphere. The temperature of the furnace was raised to 900° C. at a temperature raising rate of 300° C./hr. When the temperature reached 900° C. 100% hydrogen gas was introduced under atmospheric pressure to change the atmosphere of the furnace to a hydrogen atmosphere. The quartz glass product was maintained at the temperature for 7 hours to have hydrogen molecule contained in the quartz glass.

The amount of OH contained in the quartz glass thus obtained was 200 ppm and the amount of dissolved hydrogen determined by Raman spectrometry was not more than $1 \times 10^{17}$ molecule/cm$^3$. Further, the amount of hydrogen molecule released when heated to 1,000° C. in vacuum was $0.5 \times 10^{20}$ molecule/cm$^2$. KrF excimer laser was irradiated to the quartz glass under conditions of 200 mJ/cm$^2$·pulse and 200 Hz, and an intensity of fluorescence was measured. As shown in. FIG. 1, the quartz glass showed fluorescence at 650 nm with irradiation of KrF excimer laser and it was found that there was an absorption band in the vicinity of 260 nm. Therefore, the quartz glass is not suitable for substrate for photomask or optical parts using KrF excimer laser as light source.

COMPARATIVE EXAMPLE 3

A porous quartz glass product having diameter of 8 cm and a length of 10 cm which was obtained in the same manner as in Example 1, was fitted in an electric furnace capable of controlling an atmosphere at room temperature under ordinary pressure. Then, a helium gas passed through a bubbler wherein pure water was heated at 80° C., was introduced in 3 ι/min to replace the furnace with an atmosphere containing water vapor. Under this atmosphere, the porous quartz glass product was heated to 1,500° C. at a temperature raising rate of 500° C./hr and maintained at 1,500° C. for 3 hours to conduct transparent vitrification. The transparent quartz glass thus obtained was heated to 1,750° C., a temperature of not lower than the softening point, in an electric furnace having a carbon heating element and self-weight deformation was conducted, followed by molding into a block shape of 3×3×4 cm. Then, the molded block was left in the electric furnace and the temperature of the furnace was lowered to 1,200° C., and annealing was conducted at cooling rate of 30° C./hr. When the temperature of the furnace reached 1,000° C., power supply was stopped and the quartz glass was left to cool in the furnace.

The quartz glass block thus obtained was placed in an electric furnace capable of controlling an atmosphere and the temperature was raised to 1,000° C. at a temperature raising rate of 300° C./hr. The temperature was reached 1,000° C., 100% hydrogen gas was introduced under atmospheric pressure to replace the atmosphere of the furnace with a hydrogen atmosphere, and the quartz glass was maintained at the temperature for 7 hours to have hydrogen molecules contained in the quartz glass.

The amount of OH contained in the quartz glass thus obtained was 1,100 ppm and the amount of dissolved hydrogen determined by Raman spectrometry was not more than $1 \times 10^{17}$ molecule/cm$^3$. Further, the amount of hydrogen molecule released when heated to 1,000° C. in vacuum was $0.9 \times 10^{20}$ molecule/m$^2$. KrF excimer laser was irradiated to the quartz glass under conditions of 200 mJ/cm$^2$·pulse and 200 Hz and an intensity of fluorescence was measured.

As shown in FIG. 1, in this quartz glass, fluorescence at 650 nm easily appeared as compared with other quartz glass product with irradiation of KrF excimer laser and it was found that an absorption band in the vicinity of 260 nm also easily appeared. Therefore, this quartz glass is unsuitable for substrate for photomask or optical parts using KrF excimer laser as light source.

EXAMPLE 2

A porous quartz glass product having diameter of 9 cm and a length of 10 cm which was obtained in the same manner as in Example 1, was fitted in an electric furnace capable of controlling an atmosphere and having a graphite heating element at room temperature under an ordinary pressure. Then, the temperature was raised to 1,200° C. at a temperature raising rate of 500° C./hr and a nitrogen gas containing 1% of chlorine gas was introduced to change the atmosphere of the furnace to an atmosphere containing chlorine. The porous quartz glass was maintained at 1,250° C. for 4 hours to conduct dehydration in the chlorine atmosphere and further the quartz glass was maintained for 4 hours in the nitrogen atmosphere. Then, 100% of helium gas was introduced and the atmosphere was changed to an helium atmosphere. The porous quartz glass product was heated to 1,500° C. at a temperature raising rate of 500° C./hr and maintained at 1,500° C. for 3 hours to conduct transparent vitrification. The transparent quartz glass thus obtained was heated to 1,750° C., a temperature of not lower than the softening point, in an electric furnace having a carbon heating element and self-weight deformation was conducted, followed by molding into a block shape of 3×3×4 cm. Leaving the molded block in the electric furnace, the temperature of the electric furnace was lowered to 1,200° C. and then, annealing was conducted at cooling rate of 30° C./hr. When the temperature of the furnace reached 1,000° C., power supply was stopped and the quartz glass was left to cool in the furnace.

The quartz glass block thus obtained was placed in an electric furnace capable of controlling an atmosphere and the temperature was raised to 1,000° C. at a temperature raising rate of 300° C./hr. When the temperature reached 1,000° C., 100% hydrogen gas was introduced under atmospheric pressure to make the atmosphere of the furnace to a hydrogen atmosphere, and the quartz glass was maintained at the temperature for 7 hours to have hydrogen molecules contained in the quartz glass.

The amount of OH contained in the quartz glass thus obtained was 3 ppm and the concentration of chlorine contained in the quartz glass was 440 ppm. Further, the amount of hydrogen molecule released when heated to 1,000° C. in vacuum was $0.3 \times 10^{20}$ molecule/m$^2$. KrF excimer laser was irradiated to the quartz glass under conditions of 200 mJ/cm$^2$·pulse and 200 Hz and an intensity of fluorescence was measured. It was confirmed that the quartz glass did not show fluorescence at 650 mm at all with irradiation of KrF excimer laser but very weak fluorescence at 390 nm was observed. The intensity of luminescence at 390 nm of this quarts glass is weak as compared with the intensity of luminescence at 650 nm of the quartz glass in Comparative Example 1. Thus, this quartz glass has no problem when it is used for substrate for photomask or optical parts using KrF excimer laser as light source.

COMPARATIVE EXAMPLE 4

A porous quartz glass product having diameter of 9 cm and a length of 10 cm which was obtained in the same manner as in Example 1, was fitted in an electric furnace capable of controlling an atmosphere and having a graphite heating element at room temperature under ordinary pressure. Then, The temperature was raised to 1,200° C. at a temperature raising rate of 500° C./hr and a nitrogen gas containing 1% chlorine gas was introduced to change the atmosphere of the furnace to an atmosphere containing chlorine. The porous quartz glass was maintained at 1,250° C. for 4 hours to conduct dehydration in the chlorine atmosphere. The quartz glass product dehydrated was maintained for 8 hours in a nitrogen atmosphere. Then, 100% of helium gas was introduced to change the atmosphere to helium atmosphere. The porous quartz glass product was raised to 1,500° C. at a temperature raising rate of 500° C./hr and maintained at 1,500° C. for 3 hours to conduct transparent vitrification.

The transparent quartz glass product thus obtained was heated to 1,750° C., a temperature of not lower than the softening point, in an electric furnace having a carbon heating element and self-weight deformation was conducted, followed by molding into a block shape of $3 \times 3 \times 4$ cm. Leaving the molded block in the electric furnace, the temperature of the electric furnace is lowered to 1,200° C. and then annealing was conducted at a cooling rate of 30° C./hr. When the temperature of the furnace reached 1,000° C., power supply was stopped and the quartz glass was left to cool in the furnace.

The amount of OH contained in the quartz glass product thus obtained was 3 ppm and the concentration of chlorine contained in the quartz glass was 360 ppm. Further, the amount of hydrogen molecule released when heated to 1,000° C. in vacuum was $0.4 \times 10^{20}$ molecule/m$^2$. KrF excimer laser was irradiated to the quartz glass under conditions of 200 mJ/cm$^2$·pulse and 200 Hz and an intensity of fluorescence was measured. It was found that this quartz glass did not show fluorescence at 650 nm with irradiation of KrF excimer laser, but strong fluorescence at 390 nm was observed. The intensity of the luminescence at 390 mm was stronger by about 2 orders than the intensity at 390 nm in Example 2. Thus, this quartz glass can not be used for substrate for photomask or optical parts using KrF excimer laser as light source.

EXAMPLE 3

A porous quartz glass product having a diameter of 9 cm and a length of 10 cm which was obtained in the same manner as in Example 1, was fitted in an electric furnace capable of controlling an atmosphere and having a graphite heating element at room temperature under ordinary pressure. Then, the temperature was raised to 1,200° C. at a temperature raising rate of 500° C./hr and a nitrogen gas containing 1.5% of CHF$_3$ was introduced to change the atmosphere of the furnace to an atmosphere containing fluorine. The porous quartz glass was maintained at 1,250° C. for 4 hours to dehydrate in a chlorine-containing atmosphere. Then, 100% of helium gas was introduced to change the atmosphere to a helium atmosphere and the porous quartz glass product was raised to 1,500° C. at a temperature raising rate of 500° C./hr. The porous quartz glass product was maintained for 3 hours to conduct transparent vitrification.

The transparent quartz glass thus obtained was heated to 1,750° C., a temperature of not lower than the softening point, in an electric furnace having a carbon heating element and self-weight deformation was conducted, followed by molding into a block shape of $3 \times 3 \times 4$ cm. Leaving the molded block in the electric furnace, the temperature of the furnace was lowered to 1,200° C. and then, annealing was conducted at a cooling rate of 30° C./hr. When the temperature of the furnace reached 1,000° C., power supply was stopped and left the quartz glass was left to cool in the furnace.

The quartz glass block thus obtained was placed in an electric furnace capable of controlling an atmosphere and the temperature was raised to 1,000° C. at a temperature raising rate of 300° C./hr. When the temperature reached 1,000° C., 100% hydrogen gas was introduced under atmospheric pressure to change the atmosphere of the furnace to a hydrogen atmosphere. The quartz glass block was maintained at the temperature for 7 hours to have hydrogen molecules contained in the quartz glass.

The amount of OH contained in the quartz glass thus obtained was 5 ppm and the concentration of chlorine contained in the quartz glass was 2,500 ppm. Further, the amount of dissolved hydrogen molecule determined by Raman spectrometry was not more than $1 \times 10^{17}$ molecule/cm$^3$. Furthermore, the amount of hydrogen molecule released when heated to 1,000° C. in vacuum was $0.4 \times 10^{20}$ molecule/m$^2$. KrF excimer laser was irradiated to the quartz glass under conditions of 200 mJ/cm$^2$·pulse and 200 Hz and an intensity of fluorescence was measured. No fluorescence at 650 nm was observed at all with irradiation of KrF excimer laser and it was confirmed that no absorption band in the vicinity of 260 nm was observed. Thus, this quartz glass is suitable for substrate for photomask or optical parts using KrF excimer laser as light source.

EXAMPLE 4

A porous quartz glass product having a diameter of 9 cm and a length of 10 cm which was obtained in the same manner as in Example 1, was fitted in an electric furnace capable of controlling an .atmosphere and having a graphite heating element at room temperature under ordinary pressure. Then, the temperature was raised to 1,200° C. at a temperature raising rate of 500° C./hr and a nitrogen gas containing 2% of chlorine gas was introduced to change the atmosphere of the furnace to an atmosphere containing chlorine. The porous quartz glass was maintained at 1,250° C. for 5 hours to dehydrate in the chlorine atmosphere. 100% of helium gas was introduced to change the atmosphere to a helium atmosphere and the porous quartz glass product was raised to 1,500° C. at a temperature raising rate of 500° C./hr and maintained at 1,500° C. for 3 hours to conduct transparent vitrification.

The transparent quartz glass thus obtained was heated to 1,750° C., a temperature of not lower than the softening point, in an electric furnace having a carbon heating element and self-weight deformation was conducted, followed by molding into a block shape of 3×3×4 cm. Leaving the molded block in the electric furnace, the temperature of the furnace was lowered to 1,200° C. and then, annealing was conducted at a cooling rate of 30° C./hr. When the temperature of the furnace reached 1,000° C., power supply was stopped and the quartz glass was left to cool in the furnace.

The quartz glass block thus obtained was placed in an electric furnace capable of controlling an atmosphere and the temperature was raised to 1,000° C. at a temperature raising rate of 300° C./hr. When the temperature reached 1,000° C., 30% hydrogen gas was introduced under atmospheric pressure to change the atmosphere of the furnace to a hydrogen atmosphere and the quartz glass block was maintained at the temperature for 7 hours to have hydrogen molecules contained in the quartz glass.

The amount of OH contained in the quartz glass thus obtained was 1 ppm and the concentration of chlorine contained in the quartz glass was 1,500 ppm. Further, the amount of hydrogen released when heated to 1,000° C. in vacuum was $2 \times 10^{18}$ molecule/m$^2$. KrF excimer laser was irradiated to the quartz glass under conditions of 200 mJ/cm$^2$·pulse and 200 Hz and an intensity of fluorescence was measured. No fluorescence at 650 nm was observed at all by irradiation of KrF excimer laser and it was confirmed that no absorption band in the vicinity of 260 nm was observed. Thus, this quartz glass is suitable for substrate for photomask or optical parts using KrF excimer laser as light source.

COMPARATIVE EXAMPLE 5

A porous quartz glass product having a diameter of 9 cm and a length of 10 cm which was obtained in the same manner as in Example 1, was fitted in an electric furnace capable of controlling an atmosphere and having a graphite heating element at room temperature under ordinary pressure. Then, the temperature was raised to 1,200° C. at a temperature raising rate of 500° C./hr and then a nitrogen gas containing 1.5% of chlorine gas was introduced to change the atmosphere of the furnace to an atmosphere containing chlorine. The porous quartz glass product was maintained at 1,250° C. for 5 hours to dehydrate in the chlorine atmosphere. 100% He gas was introduced to change the atmosphere to a helium atmosphere. The porous quartz glass product was raised to 1,500° C. at a temperature raising rate of 500° C./hr and maintained at a 1,500° C. for 3 hours to conduct transparent vitrification.

The transparent quartz glass thus obtained was heated to 1,750° C., a temperature of not lower than the softening point, in an electric furnace having a carbon heating element and self-weight deformation was conducted, followed by molding into a block shape of 3×3×4 cm. Leaving the molded block in the electric furnace, the temperature of the furnace was lowered to 1,200° C. and then, annealing was conducted at a cooling rate of 30° C./hr. When the temperature of the furnace reached 1,000° C., power supply was stopped and the quartz glass was left to cool in the furnace.

The quartz glass block thus obtained was placed in an electric furnace capable of controlling an atmosphere and the temperature was raised to 1,000° C. at a temperature raising rate of 300° C./hr. When the temperature reached 1,000° C., 10% hydrogen gas was introduced under atmospheric pressure to change the atmosphere of the furnace to a hydrogen atmosphere. The quartz glass block was maintained at the temperature for 7 hours to have hydrogen molecules contained in the quartz glass.

The amount of OH contained in the quartz glass thus obtained was 2 ppm and the concentration of chlorine contained in the quartz glass was 900 ppm. Further, the amount of hydrogen molecule released when heated to 1,000° C. in vacuum was $5 \times 10^{17}$ molecule/cm$^2$. KrF excimer laser was irradiated to the quartz glass under conditions of 200 mj/cm$^2$·pulse and 200 Hz and an intensity of fluorescence was measured. By irradiation of KrF excimer laser, fluorescence at 285 nm and 460 nm was observed in this quartz glass. As irradiation was continued, fluorescence at 650 nm was observed and the intensity increased, whereby it became clear that an absorption band in the vicinity of 260 nm was observed. Accordingly, this quartz glass can not be used as substrate for photomask or optical parts using KrF excimer laser as light source.

As mentioned above, the quartz glass of the present invention does not show absorption bands or fluorescence due to structural defects by irradiation of excimer laser and has excellent excimer laser resistance.

Further, according to the present invention, the amount of OH contained in the quartz glass is reduced and hydrogen is contained, whereby absolute amounts of an OH group, oxygen-excess type defect and dissolved oxygen molecule which are precursors of fluorescence center at 650 nm and an absorption band at 260 nm formed by irradiation of excimer laser, can be reduced, and quartz glass having substantial resistance by irradiation of excimer laser can be obtained.

Furthermore, when hydrogen molecules are contained in the quartz glass subjected to dehydration by halogen, centers of fluorescence at 285 nm, 390 nm and 460 nm formed by the dehydration by halogen can be removed. In addition to the effects, the present invention has such effects that absorption bands in the vicinity of 250 nm and 163 nm formed by the dehydration by halogen can also be removed by having hydrogen molecules contained in the quartz glass.

What is claimed is:

1. Quartz glass obtained by flame-hydrolyzing a glass-forming raw material to obtain fine particles of quartz glass, having the fine particles of quartz glass deposited and grown on a substrate to obtain a porous quartz glass product and heating the porous quartz glass product to obtain a transparent quartz glass product, which has an OH content of not more than 10 ppm, a halogen content of at least 400 ppm and which contains hydrogen, wherein the amount of hydrogen molecules released when heated to 1,000° C. under vacuum is in the range of from $1 \times 10^{18}$ to $1 \times 10^{20}$ molecule/m$^2$.

2. The quartz glass according to claim 1, wherein the halogen contained is chlorine.

3. The quartz glass according to claim 1, wherein the halogen contained is fluorine.

* * * * *